United States Patent
Upendra et al.

(10) Patent No.: US 12,211,770 B2
(45) Date of Patent: Jan. 28, 2025

(54) SEMICONDUCTOR PACKAGE AND LEAD FRAME WITH ENHANCED DEVICE ISOLATION

(71) Applicant: Infineon Technologies Austria AG, Villach (AT)

(72) Inventors: Balehithlu Manjappaiah Upendra, Singapore (SG); Kok Kiat Koo, Singapore (SG)

(73) Assignee: Infineon Technologies Austria AG, Villach (AT)

(*) Notice: Subject to any disclaimer, the term of this patent is extended or adjusted under 35 U.S.C. 154(b) by 428 days.

(21) Appl. No.: 17/480,341

(22) Filed: Sep. 21, 2021

(65) Prior Publication Data

US 2023/0088833 A1   Mar. 23, 2023

(51) Int. Cl.
| | |
|---|---|
| H01L 23/495 | (2006.01) |
| H01L 21/56 | (2006.01) |
| H01L 23/00 | (2006.01) |
| H01L 25/18 | (2023.01) |

(52) U.S. Cl.
CPC .... *H01L 23/4951* (2013.01); *H01L 23/49575* (2013.01); *H01L 25/18* (2013.01); *H01L 21/56* (2013.01); *H01L 24/32* (2013.01); *H01L 24/48* (2013.01); *H01L 2224/32245* (2013.01); *H01L 2224/48145* (2013.01); *H01L 2224/48245* (2013.01)

(58) Field of Classification Search
None
See application file for complete search history.

(56) References Cited

U.S. PATENT DOCUMENTS

| | | | |
|---|---|---|---|
| 3,902,148 A | 8/1975 | Drees et al. | |
| 4,924,291 A | 5/1990 | Lesk et al. | |
| 6,077,724 A * | 6/2000 | Chen | H01L 23/4951 |
| | | | 438/109 |
| 6,087,722 A | 7/2000 | Lee et al. | |
| 6,201,186 B1 * | 3/2001 | Daniels | H01L 23/4951 |
| | | | 361/813 |

(Continued)

FOREIGN PATENT DOCUMENTS

| | | |
|---|---|---|
| JP | S63293963 A | 11/1988 |
| JP | H0228966 A | 1/1990 |

(Continued)

*Primary Examiner* — Michelle Mandala
*Assistant Examiner* — Jordan M Klein
(74) *Attorney, Agent, or Firm* — Murphy, Bilak & Homiller, PLLC (57) ABSTRACT

A semiconductor package includes a first semiconductor die, a first group of leads that each comprise an interior end, and an encapsulant body of electrically insulating material that encapsulates the semiconductor die and the interior ends of the leads from the first group, wherein a gap is disposed between outer sidewalls of two immediately adjacent ones of the leads from the first group, wherein the first semiconductor die is mounted on the first group of leads such that a lower surface of the first semiconductor die faces and overlaps with each of the leads from the first group, and wherein the lower surface of the first semiconductor die extends across the gap between outer sidewalls of two immediately adjacent ones of the leads from the first group.

19 Claims, 4 Drawing Sheets

(56) References Cited

U.S. PATENT DOCUMENTS

| | | | |
|---|---|---|---|
| 6,437,447 B1 | 8/2002 | Huang et al. | |
| 7,161,232 B1 | 1/2007 | Lee et al. | |
| 2007/0001278 A1* | 1/2007 | Jeon | H01L 23/4951 |
| | | | 257/E23.125 |
| 2010/0006993 A1* | 1/2010 | Trasporto | H01L 23/3107 |
| | | | 257/676 |
| 2020/0343168 A1* | 10/2020 | Cadag | H01L 21/4828 |

FOREIGN PATENT DOCUMENTS

| | | |
|---|---|---|
| KR | 20130140355 A | 12/2013 |
| TW | 201419649 A | 5/2014 |

* cited by examiner

SEMICONDUCTOR PACKAGE AND LEAD FRAME WITH ENHANCED DEVICE ISOLATION

TECHNICAL FIELD

The instant application relates to semiconductor packaging, and more particularly to lead frame designs for molded semiconductor packages.

BACKGROUND

High voltage semiconductor devices such as MOSFETs (metal oxide semiconductor field effect transistors) or IGBTs (insulated gate bipolar transistors) can be packaged using a molded semiconductor package that includes a number of metal leads protruding out from an encapsulant body of electrically insulating mold compound. There is a desire to make semiconductor packages as small as possible so as to reduce cost and increase component density. However, the desire to reduce package size conflicts with design requirements and practical limitations. For example, semiconductor packages must be designed to meet electrical isolation requirements, which is particularly challenging in the case of power applications wherein the semiconductor die accommodates a large voltage potential. Moreover, design rules assembly limit the ability to scale a semiconductor package in certain dimensions. One example of such a design rule requires a minimum separation distance between the edge of the semiconductor die and the edge of the die pad. This ensures that the semiconductor die will be reliably placed on the die pad and sufficiently electrically isolated form other elements of the semiconductor package. Thus, there is a conflict between the desire to scale semiconductor packages and the need to ensure reliable assembly and operation of packaged semiconductor devices.

SUMMARY

Those skilled in the art will recognize additional features and advantages upon reading the following detailed description, and upon viewing the accompanying drawings.

A semiconductor package is disclosed. According to an embodiment, the semiconductor package comprises a first semiconductor die, a first group of leads that each comprise an interior end, an encapsulant body of electrically insulating material that encapsulates the semiconductor die and the interior ends of the leads from the first group, wherein a gap is disposed between outer sidewalls of two immediately adjacent ones of the leads from the first group, wherein the first semiconductor die is mounted on the first group of leads such that a lower surface of the first semiconductor die faces and overlaps with each of the leads from the first group, and wherein the lower surface of the first semiconductor die extends across the gap between outer sidewalls of two immediately adjacent ones of the leads from the first group.

Separately or in combination, the first group of leads comprises a first lead and a second lead, wherein a first interior one of the outer sidewalls from the first lead faces a first interior one of the outer sidewalls from the second lead, and wherein the gap extends between the first interior one of the outer sidewalls from the first lead and the first interior one of the outer sidewalls from the second lead.

Separately or in combination, the first interior one of the outer sidewalls from the first lead intersects the interior end of the first lead, wherein the first interior one of the outer sidewalls from the second lead intersects the interior end of the second lead, and wherein the first interior one of the outer sidewalls from the first lead runs substantially parallel to the first interior one of the outer sidewalls from the second lead.

Separately or in combination, a separation distance between the first interior one of the outer sidewalls from the first lead and the first interior one of the outer sidewalls from the second lead is at least one millimeter.

Separately or in combination, the first semiconductor die comprises a first terminal disposed on the lower surface of first semiconductor die, and wherein the first terminal faces and electrically connects with one or both of the first and second leads.

Separately or in combination, the first terminal faces and electrically connects with the first lead, and wherein the second lead is electrically inactive.

Separately or in combination, the semiconductor package further comprises a second group of leads that are arranged in a row between the first and second leads from the first group, the first semiconductor die further comprises a second group of terminals disposed on an upper surface of first semiconductor die that is opposite from the lower surface of first semiconductor die, and the second group of terminals are electrically connected to the second group of leads.

Separately or in combination, at least 50 percent of the overall area of the lower surface of the first semiconductor die is unsupported.

Separately or in combination, at least 70 percent of the overall area of the lower surface of the first semiconductor die is unsupported.

Separately or in combination, the first semiconductor die is mounted on the first group of leads such that portions of the first group of leads that extend to the interior ends of the first group of leads are non-overlapping with the lower surface of the first semiconductor die.

Separately or in combination, the semiconductor package further comprises a third group of leads that are arranged an opposite side of semiconductor package as the first group of leads, wherein a second gap is disposed between outer sidewalls of two immediately adjacent ones of the leads from the third group, and wherein the lower surface of the first semiconductor die extends across the second gap between outer sidewalls of two immediately adjacent ones of the leads from the second group.

Separately or in combination, the semiconductor package further comprises a second semiconductor die, and a third group of leads that are arranged an opposite side of semiconductor package as the first group of leads, wherein a second gap is disposed between outer sidewalls of two immediately adjacent ones of the leads from the third group, and wherein the lower surface of the second semiconductor die extends across the second gap between outer sidewalls of two immediately adjacent ones of the leads from the second group.

According to another embodiment, the semiconductor package comprises a first group of leads that each comprise an interior end and outer sidewalls that are opposite one another, a second group of leads that each comprise an interior end and outer sidewalls that are opposite one another, a power transistor die comprising first and second load terminals and a control terminal, a driver die comprising an output terminal, and an encapsulant body of electrically insulating material that encapsulates the semiconductor die and the interior ends of the leads from the first and second groups, wherein the power transistor die is mounted on the first group of leads such that a lower surface of the power transistor die faces and overlaps with each of the leads from the first group, wherein the driver die is mounted on the second group of leads such that a lower surface of the driver die faces and overlaps with each of the leads from the second group.

A method of forming a semiconductor package is disclosed. According to an embodiment, the method comprises providing a first group of leads that each comprise an interior end and outer sidewalls that are opposite one another, providing a first semiconductor die, mounting the first semiconductor die on the first group of leads such that a lower surface of the first semiconductor die faces and overlaps with each of the leads from the first group; and forming an encapsulant body of electrically insulating material that encapsulates the semiconductor die and the interior ends of the leads from the first group, wherein a gap is disposed between the outer sidewalls of two immediately adjacent ones of the leads from the first group, and wherein a first areal portion of the lower surface of the first semiconductor die extends over a gap between the leads from the first group.

Separately or in combination, providing the first group of leads comprises providing lead frame, and wherein the unit lead frame structure is devoid of a die pad.

Separately or in combination, the unit lead frame structure further comprises a second group of leads that each comprise an interior end and outer sidewalls that are opposite one another, and wherein a central opening of the unit lead frame structure separates the interior ends of the leads from the first group from the interior ends of the leads from the second group.

Separately or in combination, the method further comprises providing an adhesive between upper surfaces of the leads and the lower surface of the first semiconductor die, wherein the adhesive maintains a position of the first semiconductor die before forming the encapsulant body.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A and 1B, illustrates a semiconductor package, according to an embodiment.

FIG. 3, which includes FIGS. 3A, 3B, and 3C, illustrates the interior configuration of a semiconductor package, according to an embodiment.

FIG. 4, which includes FIGS. 4A, 4B, and 4C. illustrates the interior configuration of a semiconductor package, according to an embodiment.

DETAILED DESCRIPTION

Embodiments of a semiconductor package design that enables downward scaling of the package footprint while maintaining high electrical isolation of the semiconductor die or dies are disclosed herein. The lead frame of the semiconductor package is devoid of a die pad. That is, there is no large metal structure in a central region of the semiconductor package with a die attach surface that accommodates the mounting of one or more semiconductor dies completely thereon. Instead, the lead frame comprises elongated lead structures that are configured to accommodate the mounting of the semiconductor dies directly on these leads. These leads extend past other leads on the same side of the package so as to provide a gap that extends directly between these leads. Different to a lead frame that utilizes a die pad, the leads only support a fraction of the overall area of the semiconductor die, with the remaining surface area laterally overhanging past the leads. By omitting the die pad, a space reduction is made possible because there is no need to satisfy chip to die paddle clearance requirements. Moreover, this concept can be used to accommodate two semiconductor dies in a semiconductor package, wherein the omission of two die pads allows for a package size reduction by eliminating the need to provide an isolation area between the two die pads.

Figure 1A:
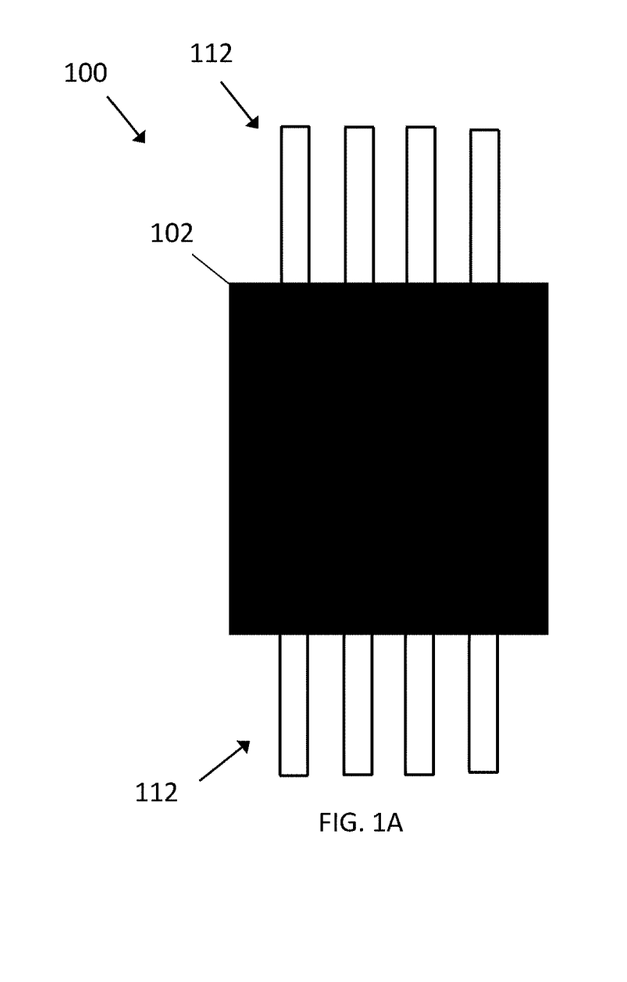
FIG. 1A illustrates a plan-view of the semiconductor package and FIG. 1B illustrates a side-view of the semiconductor package.
Figure 1B:
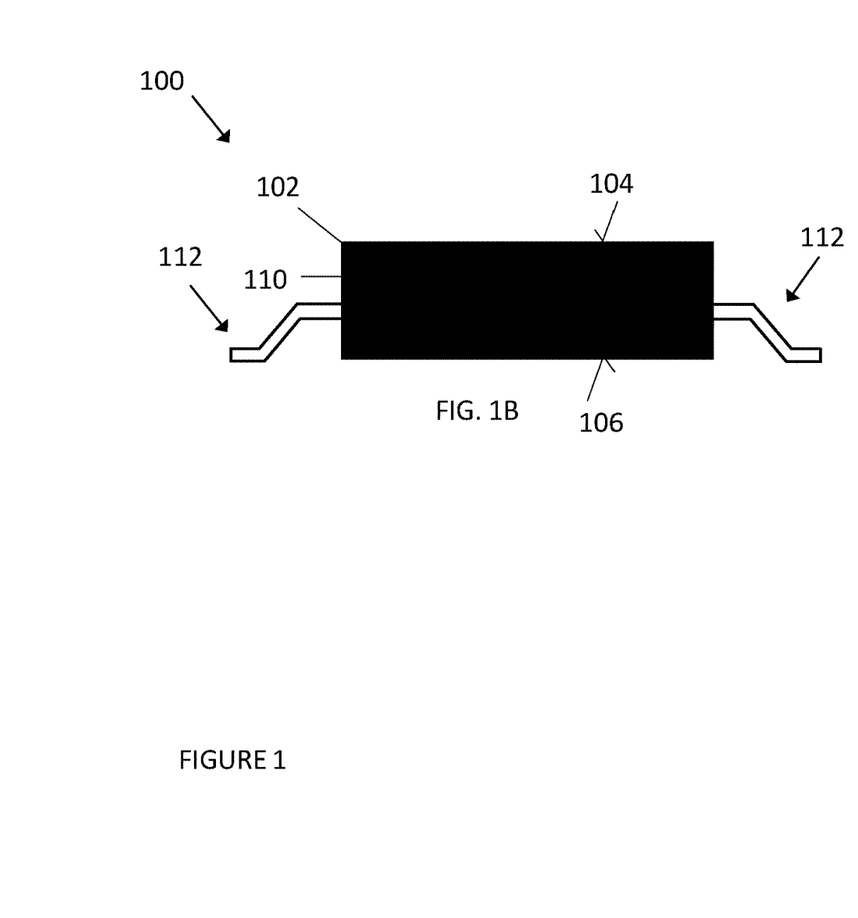

Referring to FIG. 1, a semiconductor package 100 comprises an encapsulant body 102. The encapsulant body 102 comprises an electrically insulating material such as a mold compound, epoxy, resin, ceramic, etc. The encapsulant body 102 comprises an upper surface 104 and a lower surface 106 opposite from the upper surface 104. The encapsulant body 102 further comprises outer edge sides 110 extending between the upper and lower surfaces 104, 106. The semiconductor package 100 further comprises a number of leads 112 protruding from the outer edge sides of the encapsulant body 102. The leads 112 provide externally accessible points of electrical contact to the semiconductor die or dies that are encapsulated by the encapsulant body 102. As shown, the semiconductor package 100 has a so-called surface mount device (SMD) configuration wherein the package leads 112 bend downward and comprise a contact surface that is substantially coplanar with the lower surface of the encapsulant body 102. More generally, the concepts described herein are applicable to a variety of semiconductor package 100 types, e.g., through-hole package types, no-lead package types (DFN, QFN, etc.).

The semiconductor package 100 may be configured as a discrete power device. A discrete power device refers to a single packaged device that is configured to block high voltages and and/or to conduct high currents as between two load terminals. Generally speaking, a discrete power device may be rated to block voltages of at least 100V, and more commonly on the order of 250V, 500V, 600V, 1,200V, 2,000V and/or may be rated to conduct currents of 10A, 50A, 100A, 500A or more. For example, the semiconductor package 100 may be configured as a discrete transistor package, e.g., a discrete MOSFET (Metal Oxide Semiconductor Field Effect Transistor) die, a discrete IGBT (Insulated Gate Bipolar Transistor) die, a discrete HEMT (High Electron Mobility Transistors) die, a discrete JFET (Junction Field Effect Transistors) die, etc. In addition to a switching device, the semiconductor package 100 may comprise additional elements integrated therein. For example, the semiconductor package 100 may comprise a driver die that is configured to control the switching operation of the switching device and/or may include a diode die that is configured as a reverse conduction diode. The semiconductor package 100 may also be configured as a power conversion circuit, such as a half-bridge circuit with multiple transistor dies that form the high-side switch and the low-side switch of the half-bridge circuit.

Figure 2:
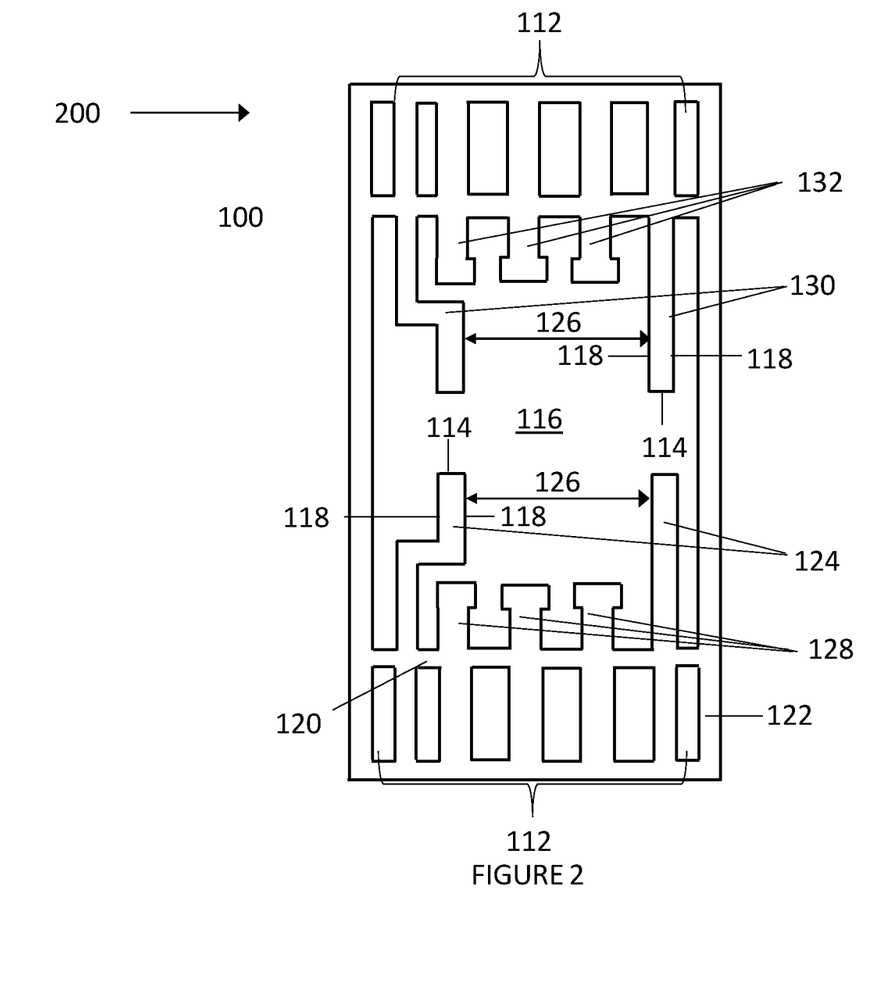
FIG. 2 illustrates a lead frame for producing a semiconductor package, according to an embodiment.

Referring to FIG. 2, an example of a lead frame 200 that is used to produce the semiconductor package 100 is depicted, according to an embodiment. The lead frame 200 is a metal structure formed from electrically conductive metals such as copper, nickel, aluminum, palladium, gold, and alloys or combinations thereof. The lead frame 200 can be provided from a substantially uniform thickness piece of sheet metal, e.g., a sheet comprising any one or more of the above listed metals, and the various features of the lead frame 200 depicted and described herein can be formed by performing metal processing techniques such as stamping, punching, etching, bending, etc., on this planar sheet of metal. The lead frame 200 can comprise a core of low-resistance metal, e.g., copper, aluminum, and one or more coatings, e.g., adhesion promotors, anti-oxidation coatings, etc. The lead frame 200 comprises a plurality of leads 112. Each of the leads 112 comprise an interior end 114 that faces a central region 116 of the lead frame 200, and outer sidewalls 118 that are opposite from one another, extend away from the interior ends 114, and extend towards a dambar structure 120 of the lead frame 200. The lead frame 200 additionally comprises a peripheral ring 122 that surrounds the features of the lead frame 200 and is attached to the leads 112. The basic geometry shown in FIG. 2 may be repeated multiple times in a lead frame strip that allows for the production of multiple ones of the semiconductor package 100 in parallel.

The lead frame 200 comprises a first group 124 of the leads 112. The leads 112 from the first group 124 are configured such that a gap 126 is disposed between the outer sidewalls 118 of immediately adjacent ones of the leads 112 from the first group 124. The leads 112 from the first group 124 may be longer than all other leads 112 that are connected to the same dambar structure 120 so that the outer sidewalls 118 of the leads 112 from the first group 124 may define the boundaries of the gap 126. That is, the outer sidewalls 118 of the leads 112 from the first group 124 directly face one another and define the gap 126. This gap 126 provides an area for a semiconductor die to be mounted without contacting other ones of the leads 112 on the same side of the semiconductor package 100 as the first group 124 of the leads 112. According to an embodiment, a total area of the gap 126 is at least 1 mm$^2$ (square millimeter), and may be in the range of 1 mm$^2$-5 mm$^2$, for example.

As shown, the first group 124 of leads 112 comprises a first one of the leads 112 and a second one of the leads 112. The first and second ones of the leads 112 define a gap 126 that extends between a first one of the outer sidewalls 118 from the first one of the leads 112 and a first one of the outer sidewalls 118 from the second one of the leads 112. According to an embodiment, the separation distance between the first one of the outer sidewalls 118 from the first one of the leads 112 and a first one of the outer sidewalls 118 from the second one of the leads 112 is least 1 mm (millimeter), and may be in the range of 1 mm-5 mm. The first one of the outer sidewalls 118 from the first one of the leads 112 lead may be parallel to the first one of the outer sidewalls 118 from the second one of the leads. Moreover, these outer sidewalls 118 may intersect with the interior ends 114 of the respective leads so as to define a gap 126 that is rectangular. Alternatively, the outer sidewalls 118 of the leads 112 from the first group 124 may have different geometries from what is shown. For example, the leads 112 from the first group 124 may have locally widened geometries, tapered geometries, etc. such that the gap 126 is not necessarily rectangular.

The lead frame 200 comprises a second group 128 of the leads 112. The second group 128 of the leads 112 are arranged in a row between the first and second ones of the leads 112 of the first group 124, and are connected to the same dambar structure 120 as the leads 112 from the first group 124. The second group 128 of the leads 112 may comprise locally widened regions at the interior ends 114 of these leads 112 so as to facilitate the attachment of bond wires thereon.

The number and configuration of the leads 112 from the first group 124 and/or the leads 112 from the second group 128 may vary from the specifically depicted embodiment. For instance, the second group 128 of the leads 112 can comprise different numbers of leads 112 from what is shown, e.g., two of the leads 112, four of the leads 112, etc. Additionally or alternatively, the first group 124 of the leads 112 may comprise additional leads 112, e.g., three, four, five, wherein one of the gaps 126 is between immediately adjacent pairs of leads 112 from the first group 124. In that case, additional ones or groups of the leads 112 may be provided between each immediately adjacent pair of leads 112 from the first group 124. Additionally or alternatively, additional ones of the leads 112 may be provided outside of the outermost ones of the leads 112 from the first group 124.

The lead frame 200 additionally comprises a third group 130 of the leads 112 and a fourth group 132 of the leads 112. The third and fourth groups 130, 132 of the leads 112 are disposed on an opposite side of the lead frame 200 and are connected to a different dambar structure 120 as the first and second groups 124, 128 of the leads 112. The leads 112 from the third group 130 are configured such that a second gap 126 is disposed between the outer sidewalls 118 of immediately adjacent ones of the leads 112 from the second group 130 in a similar manner as the first group 124 of the leads 112. As shown, the third group 130 of the leads 112 may comprise first and second ones of the leads 112 that are arranged to define the second gap 126 in a similar manner as the first and second leads 112 from the first group 124 defining the first gap 126. Moreover, the leads 112 from the fourth group 132 are arranged in a row between the first and second ones of the leads 112 of the third group 130 in a similar manner as the leads 112 from the second group 128 relative to the first group 124. In the depicted embodiment, the lead frame 200 has a symmetrical configuration wherein each of the leads 112 on one side of the semiconductor package 100 (i.e., the first and second groups of 124, 128 of the leads 112) mirror the geometry of each of the leads 112 on the opposite side of the semiconductor package 100 (i.e., the third and fourth groups 130, 132 of the leads 112). Alternatively, the lead frame 200 may have an asymmetric configuration wherein the third group 130 of the leads 112 (if present) and/or the fourth group of the 132 of leads 112 (if present) may have a different configuration as the first and second groups 124, 128 of the leads 112, respectively. These configurations include any of the previously described configurations of the leads 112 from the first and second groups 124, 128.

As can be appreciated from FIG. 2, the lead frame 200 used to produce the semiconductor package 100 is devoid of a die pad structure. Instead, the lead frame 200 only includes lead structures, i.e., elongated structures that are arranged in a row and connected with the dambar portions 120 of the lead frame 200. This allows for a reduction in package footprint by eliminating a structure that occupies a substantial amount of area, i.e., the die pad or die pads. In the case of a lead frame 200 with two die pads disposed on opposite halves of the device, the ability to shrink this structure may be limited by a minimum separation distance that must exist between the interior edge sides of the die pads that face one another. The lead frame configuration disclosed herein substantially reduces the overlap length between two conductive structures that are connected to two different dies and directly face one another. Thus, improved electrical isolation between two dies within a semiconductor package can be improved.

Figure 3A:
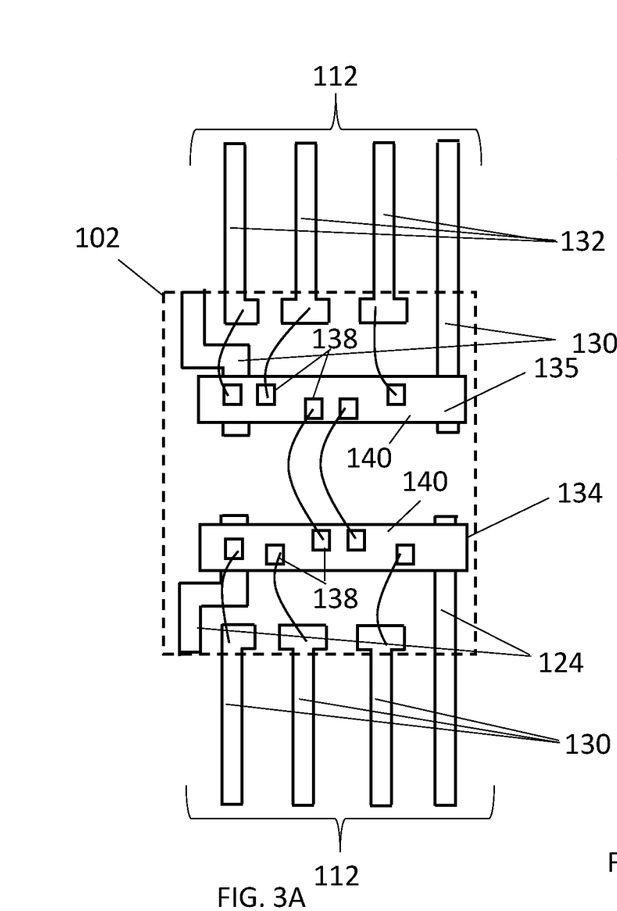
FIG. 3A illustrates a plan-view of the semiconductor package from above an upper surface of the semiconductor dies.
Figure 3B:
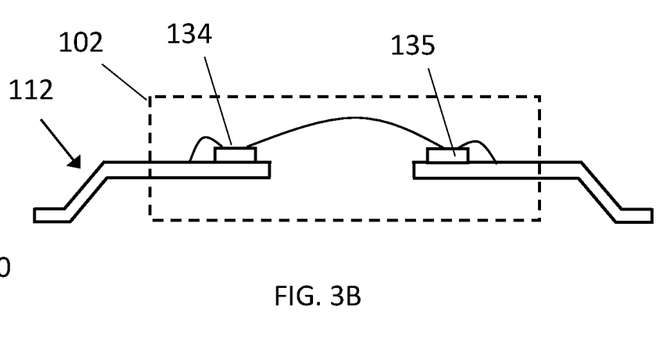
FIG. 3B illustrates a side-view of the semiconductor package.
Figure 3C:
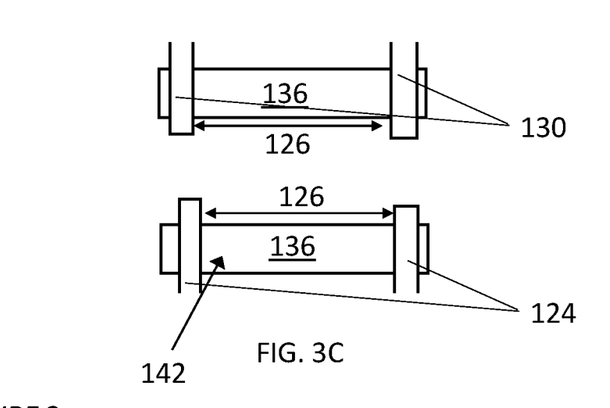
FIG. 3C illustrates a partial plan-view of the semiconductor package from below a lower surface of the semiconductor dies.

Referring to FIG. 3, the semiconductor package 100 comprises a first semiconductor die 134 mounted on the first group 124 of the leads 112. The first semiconductor die 134 is mounted such that a lower surface 136 of the first semiconductor die 134 faces and overlaps with each of the leads 112 from the first group 124. Thus, the first semiconductor die 134 is physically supported by the leads 112 from the first group 124.

According to an embodiment, the portions of the first group 124 of the leads 112 that extend to the interior end 114 of the leads 112 from the first group 124 are non-overlapping with the lower surface 136 of the first semiconductor die 134. That is, the first semiconductor die 134 is mounted such that the leads 112 from the first group 124 extend across opposite facing outer edge sides of the first semiconductor die 134. Alternatively, the interior ends 114 of the leads 112 from the first group 124 may be disposed directly underneath the first semiconductor die 134. The first semiconductor die 134 may comprise a first terminal (not shown) disposed on the lower surface 136 of the first semiconductor die 134 that is electrically connected to at least one of the first and second leads 112 from the first group 124, e.g., in the case that the first semiconductor die 134 is a vertical device. Alternatively, the first and second leads 112 from the first group 124 may exclusively serve as support structures, e.g., in the case that the first semiconductor die 134 is a lateral device. According to an embodiment the second one of the leads 112 from the first group 124 (the leftmost one of the leads 112 in FIG. 3) is electrically inactive. That is, no electrical connection is provided between the first semiconductor die 134 and this lead 112. In that case, the portion of the second one of the leads 112 from the first group 124 may be trimmed during the lead trimming process (to be described in further detail below) such that this lead 112 does not protrude out from the encapsulant body 102. Alternatively, the second one of the leads 112 may be used to provide redundant electrical connectivity with the first one of the leads 112.

According to an embodiment, the first semiconductor die 134 comprises a second group of terminals 138 disposed on an upper surface 140 of first semiconductor die 134 that is opposite from the lower surface 136 of first semiconductor die 134. At least some of the terminals 138 on the upper surface 140 of the first semiconductor die 134 are electrically connected to the leads 112 from the second group 128 of. As shown, these electrical connections are provided by bond wires. Alternatively, other types of electrical interconnect features such as clips, ribbons, etc. may be used to effectuate these electrical connections.

As shown, the semiconductor package 100 may further comprise a second semiconductor die 135. The second semiconductor die 135 is mounted on the third group 130 of the leads 112 such that a lower surface 136 of the second semiconductor die 135 faces and overlaps with each of the leads 112 from the third group 130. The second semiconductor die 135 may comprise a first terminal (not shown) disposed on the lower surface 136 of the second semiconductor die 135 that is electrically connected to at least one of the first and second ones of the leads 112 from the third group 130, e.g., in the case that the second semiconductor die 135 is a vertical device. Alternatively, the first and second leads 112 from the third group 130 may exclusively serve as support structures, e.g., in the case that the second semiconductor die 135 is a lateral device. The second semiconductor die 135 may comprises a second group of terminals 138 disposed on an upper surface 140 of second semiconductor die 135 that is opposite from the lower surface 136 of second semiconductor die 135. At least some of second group of terminals 138 from the second semiconductor die 135 may be electrically connected to the leads 112 from the fourth group 132. Moreover, at least some of the terminals 138 from the second semiconductor die 135 may be electrically connected to the terminals 138 from the first semiconductor die 134. As shown, these electrical connections are provided by bond wires. Alternatively, other types of electrical interconnect features such as clips, ribbons, etc. may be used to effectuate these electrical connections.

Generally speaking, the first and second semiconductor dies 134, 135 can have a wide variety of device configurations. For example, the first and second semiconductor dies 134, 135 can be configured as discrete devices, e.g., Metal Oxide Semiconductor Field Effect Transistors), IGBTs (Insulated Gate Bipolar Transistors), HEMTs (High Electron Mobility Transistors), diodes, etc. Alternatively or in combination, first and second semiconductor dies 134, 135 can be configured as integrated circuit devices, e.g., drivers, controllers, etc. The first and second semiconductor dies 134, 135 can include IV semiconductor materials, e.g., silicon, silicon germanium, silicon carbide, etc., and/or type III-V semiconductor materials, e.g., gallium nitride, gallium arsenide, etc. One or both of the first and second semiconductor dies 134, 135 can be configured as a vertical device, which refers to a device that is configured to current flowing between a main surface and an opposite facing rear surface of the semiconductor die. Alternatively, one or both of the first and second semiconductor dies 134, 135 can be configured as a lateral device, which refers to a device that is configured to current parallel to a main surface of the semiconductor die.

According to an embodiment, at least one of the first and second semiconductor dies 134, 135 are configured as discrete power transistors. A discrete power transistor is a switching device that is rated to accommodate voltages of at least 100 V (volts) and more commonly on the order of 600 V, 1200V or more and/or is rated to accommodate currents of at least 1 A (amperes) and more commonly on the order of 10 A, 50 A, 100 A or more. Exemplary device types of discrete power transistors include MOSFETs (Metal Oxide Semiconductor Field Effect Transistors), IGBTs (Insulated Gate Bipolar Transistors), and HEMTs (High Electron Mobility Transistors), for example.

According to an embodiment the first semiconductor die 134 is configured as a power transistor die and the second semiconductor die 135 is configured as driver die. The power transistor die comprises first and second load terminals and a control terminal. One of the first and second load terminals and the control terminal may be provided by the terminals 138 on the upper surface 140 of the first semiconductor die 134 and the other one of the first and second terminals may be provided on the lower surface 136 of the first semiconductor die 134, for example. The driver die comprises an output terminal, which may be provided by the terminals 138 on the upper surface 140 of the second semiconductor die 135. The driver die is configured to control a switching operation of the power transistor die through a connection between the output terminal of the driver die and the control terminal of the power transistor die.

Referring to FIG. 3C, a view of the lower surface 136 of the first semiconductor die 134 is provided, i.e., from the opposite perspective as the view of FIG. 3A. As can be seen, a significant percentage of the overall area of first semiconductor die 134 is unsupported by any structure. This unsupported area includes a first areal portion 142 of the lower surface 136 of the first semiconductor die 134 that extends over the gap 126 between the leads 112 from the first group 124. The first areal portion 142 may be at least 50 percent of the overall area of the lower surface 136 of the first semiconductor die 134, and may be at least 60 percent the of the overall area, at least 70 percent the of the overall area, or more. Moreover, as shown, additional portions of the lower surface 136 of the first semiconductor die 134 outside of the gap 126 may be unsupported such that the overall unsupported area may be between at least 50 percent and at least 95 percent of the of the overall area of the lower surface 136 of the first semiconductor die 134 in various embodiments. The lower surface 136 of the second semiconductor die 135 may likewise extend across the third group 130 of the leads 112 in a similar manner with the same areal portions of the lower surface 136 of the second semiconductor die 135 being unsupported.

Forming the semiconductor package 100 may include the following process steps. The lead frame 200 as shown and described with reference to FIG. 2 may be provided on a carrier. Subsequently, the first semiconductor die 134 may be mounted on the first group 124 of the leads 112 and the second semiconductor die 135 may be mounted on the third group 130 of leads 112. In the case that an electrical connection is provided between a first terminal of the first semiconductor die 134 and the first group 124 of the leads 112 and/or between a first terminal of the second semiconductor die 135 and the third group 130 of leads 112, the mounting may comprise a soldering or sintering process. In the case that no electrical connection is provided, a non-conductive an adhesive such as glue or tape may be provided between the lower surface 136 of the first semiconductor die 134 and the first group 124 of the leads 112 and/or between the lower surface 136 of the second semiconductor die 135 and the second group 128 of the leads 112. The solder material and/or non-conductive adhesive maintains the position of the first and second semiconductor dies 134, 135 during subsequent assembly steps before forming the encapsulant body 102 such that the first and second semiconductor dies 134, 135 are secured in place and do not laterally slide or slip off of the leads 112. After securing the semiconductor dies, the electrical connections between the upper surface terminals 138 of the first and second semiconductor dies 134, 135 may be completed, e.g., by performing a wire bonding process, clip attachment, etc. Subsequently, the encapsulant body 102 may be formed by a molding process such injection molding, transfer molding, compression molding, etc. Subsequently, a lead trimming process may be performed to detach each of the leads 112 from the peripheral ring 122 and the dam bar structures 120. Finally, the outer portions of the leads 112 may be bent, e.g. to have the depicted surface mount device configuration.

Figure 4A:
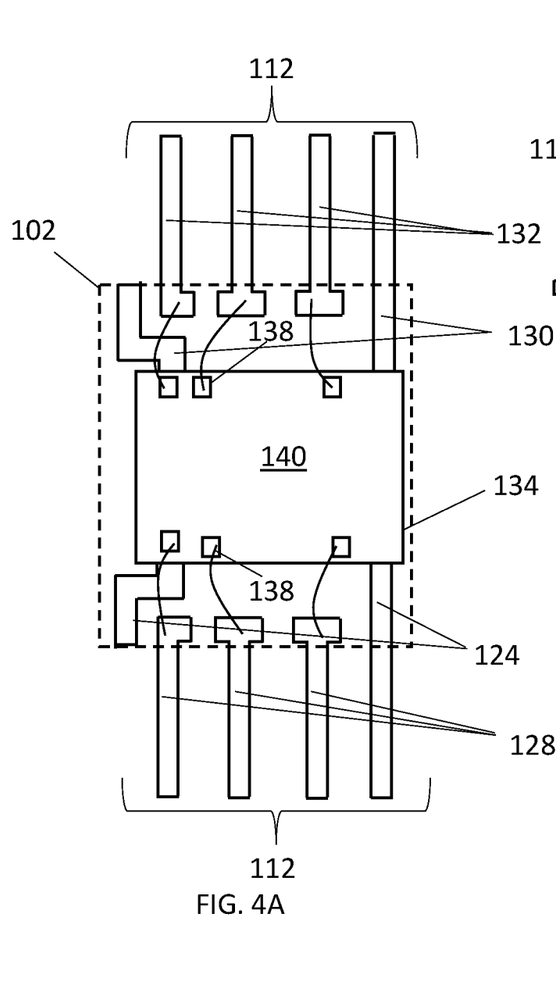
FIG. 4A illustrates a plan-view of the semiconductor package from above an upper surface of the semiconductor die.
Figure 4B:
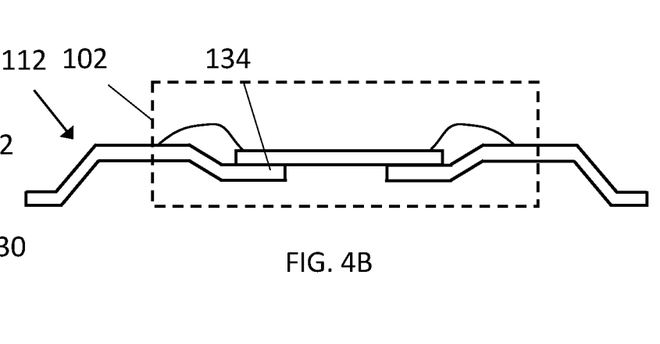
FIG. 4B illustrates a side-view of the semiconductor package.
Figure 4C:
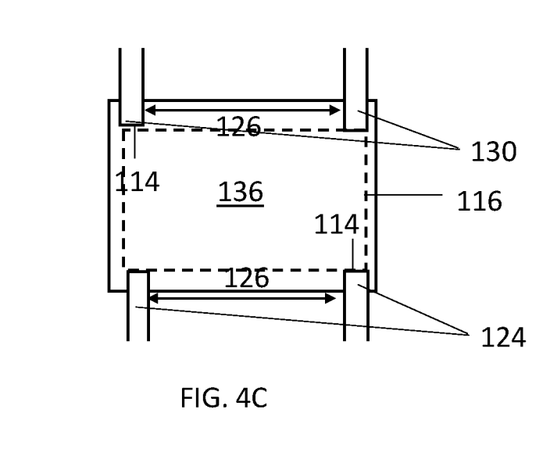
FIG. 4C illustrates a partial plan-view of the semiconductor package from below a lower surface of the semiconductor die.

Referring to FIG. 4, a semiconductor package 100 with a first semiconductor die 134 mounted on the leads 112 from the first and third groups 124, 130 of the leads 112 is depicted, according to an embodiment. In this embodiment, the lower surface 136 of the first semiconductor die 134 extends across the gap 126 between the first and second ones of the leads 112 from the first group 124 and additionally extends across the second gap 126 between the first and second ones of the leads 112 from the third group 130. Moreover, the first semiconductor die 134 extends across a central region 116 of the lead frame 200 that is between the interior ends 114 of the leads 112 from the first group 124 and the interior ends 114 of the leads 112 from the third group 130. Generally speaking, the overall unsupported area may be at least 50 percent of the overall area of the lower surface 136 of the first semiconductor die 134, and may be between 60 and 95 percent of the overall area of the lower surface 136 of the first semiconductor die 134 in various embodiments. By providing support at all four outer corners of the first semiconductor die 134, the amount of overlap with the leads 112 can be minimized and the separation distance between the interior ends 114 of the leads 112 from the first group 124 and the interior ends 114 of the leads 112 from the third group 130 can advantageously be made higher. As can also be seen in FIG. 4, the first and third groups 130 of the leads 112 may have a downset configuration wherein sections of these leads 112 that extend to the respective interior ends 114 are vertically below central sections of these leads 112. This may aid in maintaining the position of the semiconductor die 134 during assembly and before encapsulation.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor package, comprising:
a first semiconductor die;
a first group of leads that each comprise an interior end;
a second group of leads that are arranged in a row between first and second leads from the first group; and
an encapsulant body of electrically insulating material that encapsulates the first semiconductor die and the interior ends of the leads from the first group;
wherein a gap is disposed between outer sidewalls of two immediately adjacent ones of the leads from the first group, wherein the first semiconductor die is mounted on the first group of leads such that a lower surface of the first semiconductor die faces and overlaps with each of the leads from the first group
wherein the lower surface of the first semiconductor die extends across the gap between outer sidewalls of two immediately adjacent ones of the leads from the first group,
wherein the first semiconductor die further comprises a second group of terminals disposed on an upper surface of first semiconductor die that is opposite from the lower surface of first semiconductor die, and
wherein the second group of terminals are electrically connected to the second group of leads.

2. The semiconductor package of claim 1, wherein the first group of leads comprises a first lead and a second lead, wherein a first interior one of the outer sidewalls from the first lead faces a first interior one of the outer sidewalls from the second lead, and wherein the gap extends between the first interior one of the outer sidewalls from the first lead and the first interior one of the outer sidewalls from the second lead.

3. The semiconductor package of claim 2, wherein the first interior one of the outer sidewalls from the first lead intersects the interior end of the first lead, wherein the first interior one of the outer sidewalls from the second lead intersects the interior end of the second lead, and wherein the first interior one of the outer sidewalls from the first lead runs parallel to the first interior one of the outer sidewalls from the second lead.

4. The semiconductor package of claim 3, wherein a separation distance between the first interior one of the outer sidewalls from the first lead and the first interior one of the outer sidewalls from the second lead is at least one millimeter.

5. The semiconductor package of claim 2, wherein the first semiconductor die comprises a first terminal disposed on the lower surface of first semiconductor die, and wherein the first terminal faces and electrically connects with one or both of the first and second leads.

6. The semiconductor package of claim 5, wherein the first terminal faces and electrically connects with the first lead, and wherein the second lead is electrically inactive.

7. The semiconductor package of claim 1, wherein at least 50 percent of the overall area of the lower surface of the first semiconductor die is unsupported.

8. The semiconductor package of claim 7, wherein at least 70 percent of the overall area of the lower surface of the first semiconductor die is unsupported.

9. The semiconductor package of claim 1, wherein the first semiconductor die is mounted on the first group of leads such that portions of the first group of leads that extend to the interior ends of the first group of leads are non-overlapping with the lower surface of the first semiconductor die.

10. The semiconductor package of claim 1, further comprising a third group of leads that are arranged an opposite side of semiconductor package as the first group of leads, wherein a second gap is disposed between outer sidewalls of two immediately adjacent ones of the leads from the third group, and wherein the lower surface of the first semiconductor die extends across the second gap between outer sidewalls of two immediately adjacent ones of the leads from the second group.

11. The semiconductor package of claim 1, further comprising: a second semiconductor die; and a third group of leads that are arranged an opposite side of semiconductor package as the first group of leads, wherein a second gap is disposed between outer sidewalls of two immediately adjacent ones of the leads from the third group, and wherein the lower surface of the second semiconductor die extends across the second gap between outer sidewalls of two immediately adjacent ones of the leads from the third group.

12. The semiconductor package of claim 1, wherein the first and second leads from the first group are longer than the leads from the second group.

13. The semiconductor package of claim 1, wherein the first group of leads and the second group of leads collectively form a complete row of the leads at one side of the semiconductor package, and wherein the first group of leads form outermost leads on either side of the complete row of the leads.

14. The semiconductor package of claim 1, wherein the leads from the first group and the second group extend beyond an outer sidewall of the semiconductor package.

15. A semiconductor package, comprising:
a first group of leads that each comprise an interior end and outer sidewalls that are opposite one another,
a second group of leads that each comprise an interior end and outer sidewalls that are opposite one another;
a power transistor die comprising first and second load terminals and a control terminal;
a driver die comprising an output terminal; and
an encapsulant body of electrically insulating material that encapsulates the power transistor die and the driver die and the interior ends of the leads from the first and second groups,
wherein the power transistor die is mounted on the first group of leads such that a lower surface of the power transistor die faces and overlaps with each of the leads from the first group,
wherein the driver die is mounted on the second group of leads such that a lower surface of the driver die faces and overlaps with each of the leads from the second group, and
wherein the second group of leads are arranged in a row between first and second leads from the first group.

16. A method of forming a semiconductor package, the method comprising:
providing a first group of leads that each comprise an interior end and outer sidewalls that are opposite one another;
providing a second group of leads that are arranged in a row between first and second leads from the first group;
providing a first semiconductor die;
mounting the first semiconductor die on the first group of leads such that a lower surface of the first semiconductor die faces and overlaps with each of the leads from the first group; and
forming an encapsulant body of electrically insulating material that encapsulates the first semiconductor die and the interior ends of the leads from the first group;
wherein a gap is disposed between the outer sidewalls of two immediately adjacent ones of the leads from the first group, and
wherein a first areal portion of the lower surface of the first semiconductor die extends over the gap between the leads from the first group,
wherein the first semiconductor die further comprises a second group of terminals disposed on an upper surface of first semiconductor die that is opposite from the lower surface of first semiconductor die, and
wherein the second group of terminals are electrically connected to the second group of leads.

17. The method of claim 16, wherein providing the first group of leads comprises providing lead frame, and wherein the unit lead frame structure is devoid of a die pad.

18. The method of claim 17, wherein the unit lead frame structure further comprises a second group of leads that each comprise an interior end and outer sidewalls that are opposite one another, and wherein a central opening of the unit lead frame structure separates the interior ends of the leads from the first group from the interior ends of the leads from the second group.

19. The method of claim 17, further comprising providing an adhesive between upper surfaces of the leads and the lower surface of the first semiconductor die, wherein the adhesive maintains a position of the first semiconductor die before forming the encapsulant body.

* * * * *

UNITED STATES PATENT AND TRADEMARK OFFICE
CERTIFICATE OF CORRECTION

| | | |
|---|---|---|
| PATENT NO. | : 12,211,770 B2 | Page 1 of 1 |
| APPLICATION NO. | : 17/480341 | |
| DATED | : January 28, 2025 | |
| INVENTOR(S) | : B. Upendra et al. | |

It is certified that error appears in the above-identified patent and that said Letters Patent is hereby corrected as shown below:

In the Claims

Column 11, Line 11 (Claim 1), please change "of first" to -- of the first --.

Column 11, Line 12 (Claim 1), please change "of first" to -- of the first --.

Column 11, Line 38 (Claim 5), please change "of first" to -- of the first --.

Column 11, Line 56 (Claim 10), please change "arranged an" to -- arranged on an --.

Column 11, Line 57 (Claim 10), please change "of semiconductor" to -- of the semiconductor --.

Column 11, Line 66 (Claim 11), please change "arranged an" to -- arranged on an --.

Column 11, Line 66 (Claim 11), please change "of semiconductor" to -- of the semiconductor --.

Column 12, Line 64 (Claim 16), please change "of first" to -- of the first --.

Column 12, Line 65 (Claim 16), please change "of first" to -- of the first --.

Column 13, Line 2 (Claim 17), please change "providing lead" to -- providing a lead --.

Signed and Sealed this
First Day of April, 2025

Coke Morgan Stewart
*Acting Director of the United States Patent and Trademark Office*